United States Patent
Hack et al.

(10) Patent No.: US 9,379,169 B2
(45) Date of Patent: Jun. 28, 2016

(54) VERY HIGH RESOLUTION AMOLED DISPLAY

(75) Inventors: Michael Hack, Princeton, NJ (US); Michael Stuart Weaver, Princeton, NJ (US); Julia J. Brown, Yardley, PA (US); Woo-Young So, Richboro, PA (US)

(73) Assignee: Universal Display Corporation, Ewing, NJ (US)

( * ) Notice: Subject to any disclaimer, the term of this patent is extended or adjusted under 35 U.S.C. 154(b) by 87 days.

(21) Appl. No.: 13/617,791

(22) Filed: Sep. 14, 2012

(65) Prior Publication Data

US 2014/0077163 A1    Mar. 20, 2014

(51) Int. Cl.
| | |
|---|---|
| *H01L 29/08* | (2006.01) |
| *H01L 29/04* | (2006.01) |
| *H01L 29/18* | (2006.01) |
| *H01L 21/02* | (2006.01) |
| *H01L 27/32* | (2006.01) |
| *G09G 3/32* | (2016.01) |

(52) U.S. Cl.
CPC .......... *H01L 27/3262* (2013.01); *G09G 3/3258* (2013.01); *H01L 27/326* (2013.01); *G09G 2320/0214* (2013.01)

(58) Field of Classification Search
CPC .................. G09G 3/32; G09G 3/3258; G09G 2320/0214; H01L 27/322; H01L 27/326; H01L 27/3262
USPC ............................ 257/40, 88, 59, 532; 438/34
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,072,517 A * | 6/2000 | Fork et al. | 347/237 |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo et al.,"Highly efficient phosphorescent emission from organic electroluminescent devices", Nature, vol. 395, pp. 151-154, 1998.

(Continued)

*Primary Examiner* — Long K Tran
*Assistant Examiner* — Dzung Tran
(74) *Attorney, Agent, or Firm* — Morris & Kamlay LLP

(57) ABSTRACT

OLED displays having a resolution of 300 dpi, 400 dpi, or greater are provided. Devices as disclosed may use one or more transistors, such as metal oxide transistors, which have a leakage current of not more than about $10^{-15}$ A/μm. Displays having sub-pixels with a largest dimension on the order of 60 μm are also provided.

12 Claims, 4 Drawing Sheets

(56) References Cited

U.S. PATENT DOCUMENTS

| | | |
|---|---|---|
| 6,468,819 B1 | 10/2002 | Kim et al. |
| 7,279,704 B2 | 10/2007 | Walters et al. |
| 7,431,968 B1 | 10/2008 | Shtein et al. |
| 7,968,146 B2 | 6/2011 | Wagner et al. |
| 2001/0035849 A1* | 11/2001 | Kimura et al. .................. 345/76 |
| 2003/0230980 A1 | 12/2003 | Forrest et al. |
| 2004/0174116 A1 | 9/2004 | Lu et al. |
| 2005/0012686 A1* | 1/2005 | Osame et al. .................... 345/39 |
| 2006/0066526 A1* | 3/2006 | Kim et al. ........................ 345/76 |
| 2006/0234852 A1* | 10/2006 | Kim et al. ..................... 501/134 |
| 2008/0169765 A1* | 7/2008 | Yamazaki et al. ......... 315/169.3 |
| 2009/0215212 A1* | 8/2009 | Liu et al. ......................... 438/34 |
| 2010/0019656 A1* | 1/2010 | Yu et al. ......................... 313/504 |
| 2010/0025212 A1* | 2/2010 | Xu ................................. 200/341 |
| 2010/0252826 A1* | 10/2010 | Yamazaki et al. .............. 257/43 |
| 2012/0061652 A1 | 3/2012 | Sugisawa et al. |
| 2012/0217515 A1 | 8/2012 | Yamazaki et al. |

OTHER PUBLICATIONS

Baldo et al.,"Very high-efficiency green organic light-emitting devices based on electrophosphorescence", Applied Physics Letter, vol. 75, No. 1, pp. 4-6, 1999.

European Search Report and Written Opinion in EP 13 18 4286, mailed Jan. 7, 2014.

Sekine, et al., "(Invited) Success in Measurement of the Lowest Off-state Current of Transistor in the World," ECS Transactions vol. 37, No. 1, 2011, pp. 77-78.

Sugusawa, et al., "High-definition Top-emitting Reliable Oxide Semiconductor Field Effect Transistors," SID Symposium Digest of Technical Papers, vol. 42 No. 1 Jun. 2011 pp. 722-725.

Wacyk, et al., "A Low-Power AMOLED Microdisplay with Ultra-high Pixel Density and Extended Operating Temperature Range," SID Symposium Digest of Technical Papers, vol. 38 No. 1 2007 p. 1374.

* cited by examiner

VERY HIGH RESOLUTION AMOLED DISPLAY

The claimed invention was made by, on behalf of and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices and, more specifically, to devices that may be suitable for use in displays and other devices having a resolution of about 400 dpi or greater.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

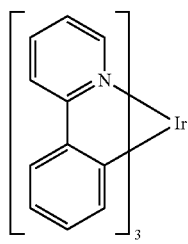

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

A light-emitting device is provided that includes a plurality of organic light-emitting devices arranged to form a multiple pixels having a combined resolution of at least 300 dpi, 400 dpi, or greater. The device further includes a circuit configured to control at least one of the organic light-emitting devices, where the circuit includes a transistor having a leakage current of not more than about $10^{-15}$ A/μm. The circuit may not include a storage capacitor. In some configurations, the circuit includes no more than two transistors. Transistors used in embodiments of the invention may include a metal oxide active layer. An external compensation driver disposed outside active areas of the light-emitting device may provide uniformity in a display. Embodiments of the invention may allow for sub-pixels having a largest dimension of not more than about 60 μm.

In an embodiment, an active matrix organic light emitting display having a resolution of at least 300 dpi, 400 dpi, or greater is provided. The display may include multiple pixels, each of which may include multiple sub-pixels. The pixels and/or sub-pixels may be independently addressable by a control circuit comprising at least one transistor having a leakage current of not more than about $10^{-15}$ A/μm. The circuit may not include a storage capacitor. In some configurations, the circuit includes no more than two transistors. Transistors used in embodiments of the invention may include a metal oxide active layer. An external compensation driver disposed outside active areas of the light-emitting device may provide uniformity in a display. Embodiments of the invention may allow for sub-pixels having a largest dimension of not more than about 60 μm.

Methods of fabricating active matrix organic light emitting devices are also provided. For example, in an embodiment, a device may be fabricated by obtaining a transistor having a leakage current of not more than about $10^{-15}$ A/μm, and fabricating an organic light emitting device in electrical contact with the transistor, which then provides a control of the organic light emitting device.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
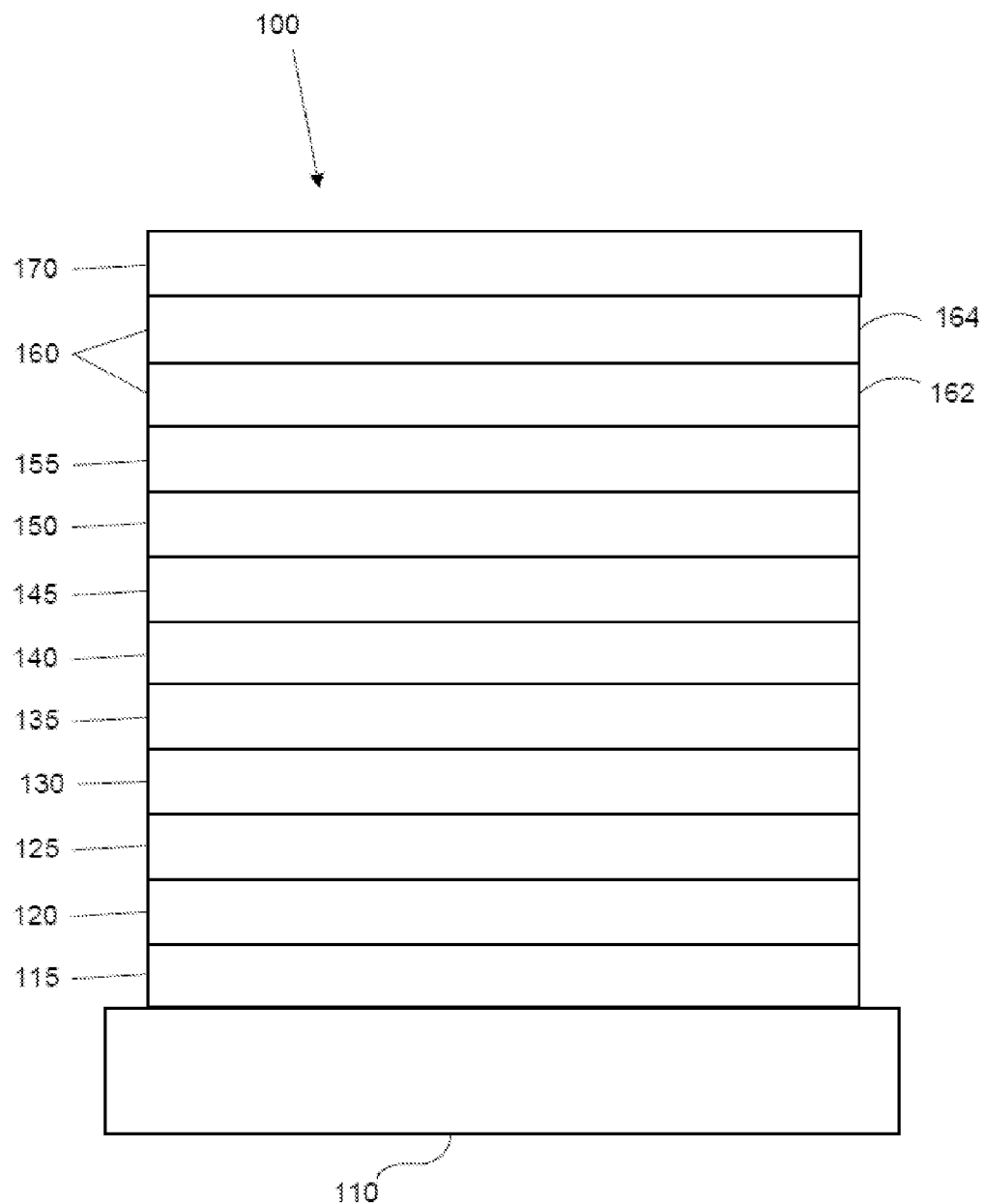
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as MgAg with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
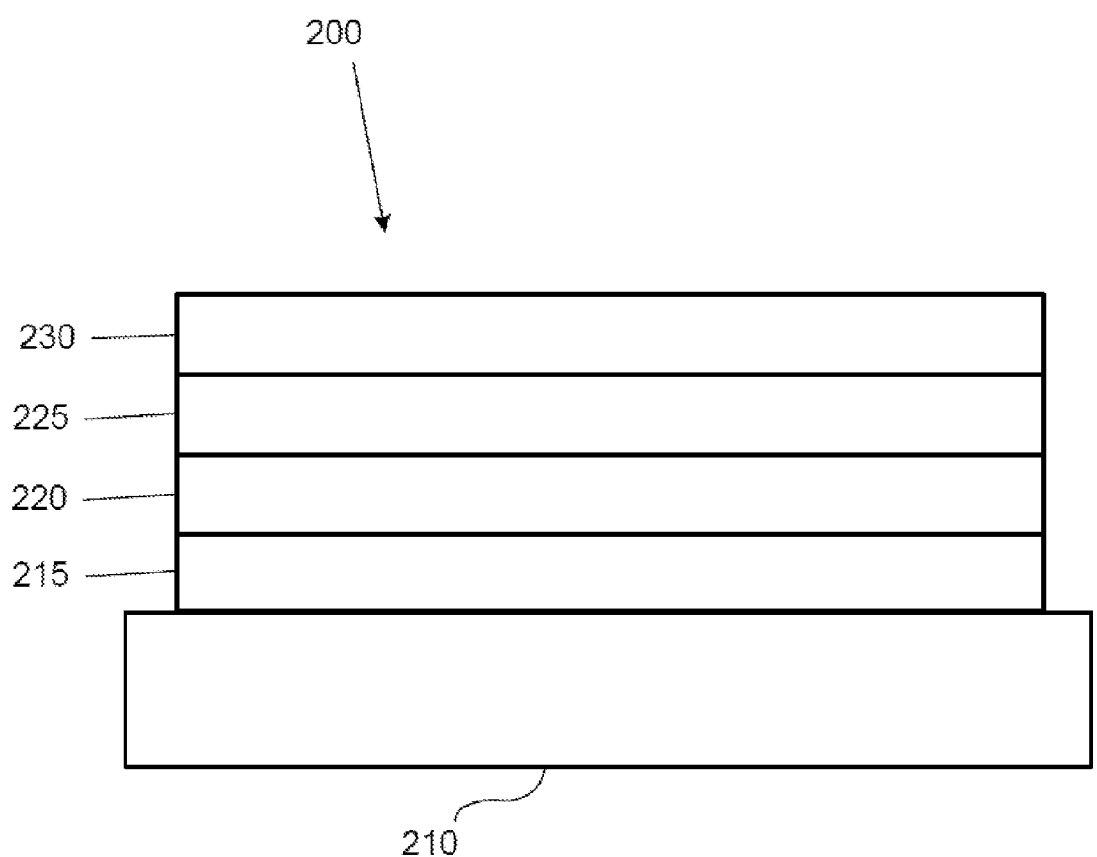
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylalkyl, heterocyclic group, aryl, aromatic group, and heteroaryl are known to the art, and are defined in U.S. Pat. No. 7,279,704 at cols. 31-32, which are incorporated herein by reference.

In some cases, active-matrix OLED (AMOLED) displays may have limited resolution due to the need to accurately place thin film transistors and patterned sub-pixels within a given region. In embodiments of the present invention, AMOLED displays with resolutions of 300 dpi (dots per inch), 400 dpi, or greater are provided.

Figure 3:
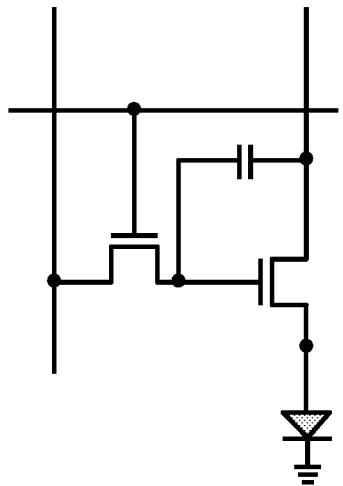
FIG. 3 shows a circuit suitable for use with a conventional OLED.

Conventional AMOLED devices incorporate storage capacitors to hold charge in the pixel during a display time frame. Each capacitor typically is incorporated into a circuit that interfaces with a sub-pixel and, therefore, the space available for the sub-pixel must take into account the space required for the capacitor. The role of the capacitor in a conventional AMOLED circuit is to store charge on the gate of the driving transistor so that small leakage currents from the switching transistor do not significantly change the current provided by the driving transistor to the OLED over the frame time, thus providing a desired OLED luminance. Other components also may be used in the circuit. For example, multi-TFT drive circuits may be used to provide uniformity in configurations that make use of low-temperature polysilicon (LTPS) techniques, or to provide stability when amorphous silicon is used. Typically any such components are incorporated into a region approximately the same size as the sub-pixel. Further, conventional OLED patterning approaches only achieve relatively small active areas due to the alignment tolerances required, for example for shadow mask alignment of red, green, and blue sub-pixels. FIG. 3 shows an example circuit suitable for use in a conventional OLED configuration, which includes a storage capacitor and a multi-TFT drive circuit.

At higher resolutions, such as 300-400 dpi and greater, these constraints may result in a pixel fill factor that is too small to support a display with an acceptable OLED lifetime. That is, the OLED may be smaller than desired due to the space required by the driving circuitry, and so the OLED needs to be driven harder to provide the desired light output, thereby reducing the lifetime of the pixel. For example, at 400 dpi, the pixel size becomes approximately 60 μm×60 μm. In some configurations, this results in a sub-pixel size of about 60 μm×20 μm or less in a full color display. This may not allow sufficient space for all the components desired or required by conventional OLED fabrication techniques. Thus, to achieve AMOLED displays with resolution of at least 300-400 dpi or greater, it is desirable to provide backplane configurations that can deliver accurate drive currents while using sub-pixel circuits that occupy a relatively small space, and/or to provide techniques for fabricating sub-pixels at a relatively high accuracy.

In an embodiment, a reduced space requirement for sub-pixel circuitry may be achieved by using a switching TFT to hold a data voltage, such as during a frame period of a display. This allows for the conventional storage capacitor to be omitted, thus decreasing the space required for the sub-pixel circuitry. In an example configuration, if the switching TFT is to hold a data voltage for 1/60 second, it is desirable for the switching TFT to have a leakage current of not more than about $10^{-15}$ amperes per micrometer of width (A/μm) to prevent undesirably affecting the next-highest gray scale voltage. In comparison, conventional LTPS TFTs typically provide a leakage current of not less than about $10^{-12}$ A/μm. In embodiments of the present invention, oxide transistors or other transistor types and configurations that provide leakage currents of not more than about $10^{-15}$ A/μm may be used. As a specific example, well IGZO TFTs may provide leakage currents of about $10^{-24}$ A/μm or less at room temperature.

The specific leakage current of transistors generally is not of concern in a conventional AMOLED pixel circuit for a conventional display with a relatively low resolution, such as less than 300-400 dpi. Conventional transistors, such as LTPS TFTs, provide leakage current and other attributes within expected operating parameters for conventional AMOLED sub-pixels. However, these configurations typically require a storage capacitor or other mechanism to store data voltage on the driving transistor during a display frame. The use of a conventional switching transistor without a capacitor to store the data voltage may result in an improper current supply of a driving transistor due to the relatively high leakage current of the conventional switching transistor in a high resolution AMOLED display. Thus, in embodiments of the invention it may be preferable to have a relatively low leakage current as described.

In an embodiment, a compensation driver also may be provided to obtain further display uniformity. Such a compensation driver may be provided outside of the sub-pixel active area and/or the display area, by using, for example, external driver chips. This also may allow the sub-pixel area to remain relatively small while still obtaining the benefit of the driver.

In embodiments of the invention, other techniques as disclosed herein also may be used to provide for reduced-size sub-pixels at a relatively high accuracy. For example, sub-pixels may be patterned using OVJP techniques as previously disclosed. OVJP may allow for sub-pixels to be patterned at an accuracy of 400 ppi or greater. Other techniques that achieve the desired accuracy also may be used. For example, OVPD techniques are capable of fabricating features as small as 20 μm, and it has been found that such techniques may be suitable for deposition of features of as small as 1.5 μm, as described in G. J. McGraw, D. L. Peters, S R. Forrest, Applied Physics Letters, 98, 013302 (2011), the disclosure of which is incorporated by reference in is entirety. As another example, white sub-pixels with color filters disposed above or below the sub-pixels may be used. Color filter configurations may be fabricated using techniques such as photolithography, which allows for feature sizes as small as 1 μm. Sub-pixels also may be fabricated using high-resolution solution printing techniques, such as ink jet printing, which are suitable for achieving the features sizes disclosed herein.

In an embodiment, conformal planarization layers may be used to dispose OLEDs over whole-pixel circuitry, such as multiple TFTs and capacitors, and/or to place pixel circuitry in each sub-pixel. Conformal planarization layers are described in further detail in, for example, U.S. Pat. No. 7,012,363, and U.S. Patent Publication No. 2005/0269943, the disclosure of each of which is incorporated by reference in its entirety.

Figure 4:
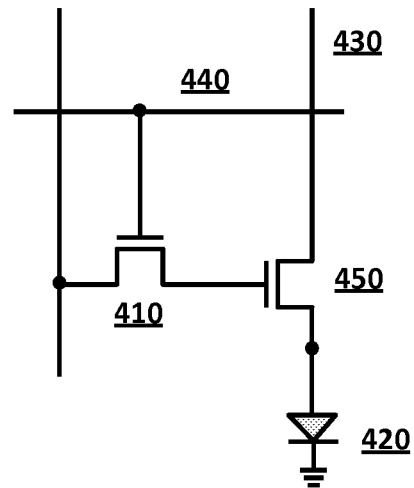
FIG. 4 shows a circuit that has a transistor with a leakage current of not more than about $10^{-15}$ A/μm.
Figure 5:
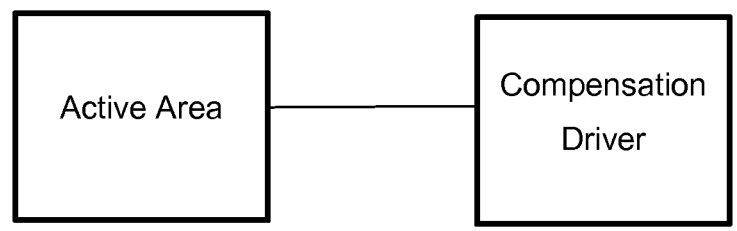
FIG. 5 shows an arrangement including a compensation driver disposed outside an active area of an OLED.

FIG. 4 shows an example circuit according to an embodiment of the present invention, which includes low-leakage current TFTs and omits a storage capacitor. An OLED 420, such as a sub-pixel of a pixel in a full-color display, may be electrically connected to a driving transistor 410 and/or a switching transistor 450. A power line 430 and scan line 440 are also identified for reference. As previously described and in comparison to the circuit of FIG. 3, the example circuit of FIG. 4 does not include a storage capacitor. The transistors 410, 450 may be relatively low-leakage current transistors, such as oxide transistors. Preferably, the transistors 410, 450 each have a leakage current of not more than about $10^{-15}$ A/μm. In an embodiment, the leakage current of each transistor 410, 450 may be selected to be within the range $10^{-15}$ A/μm to $10^{-24}$ A/μm, $10^{-15}$ A/μm to $10^{-19}$ A/μm, $10^{-18}$ A/μm to $10^{-21}$ A/μm, or $10^{-20}$ A/μm to $10^{-24}$ A/μm. In general, a lower leakage current is preferred, though in some configurations a leakage current higher than the lowest possible leakage current may be preferred to avoid undesirably increasing cost or decreasing yield.

More generally, an embodiment of the invention may provide an active matrix organic light emitting display having a resolution of at least 300 dpi, 400 dpi, or greater. In an embodiment, a device may include multiple organic light-emitting devices arranged into pixels that have a combined resolution of at least 300-400 dpi. As used herein, the "combined resolution" of a set of pixels refers to the resolution of a display, screen, or similar device that incorporates the pixels, as will be readily understood by one of skill in the art. A circuit as disclosed herein may be fabricated and configured to control each OLED, and may include at least one transistor such as the transistor 450 shown in FIG. 4, which may have a leakage current of not more than about $10^{-15}$ A/μm. The circuit may include no more than two transistors, such as transistors 410, 450 as shown in FIG. 4, and each transistor may have a leakage current of not more than about $10^{-15}$ A/μm.

As a specific example, the transistor may be a metal oxide transistor, i.e., a transistor with an active layer that includes a metal oxide. The circuit also may include or be in electrical communication with a compensation driver. To avoid increasing the size required for each light-emitting sub-pixel, the compensation driver may be disposed outside an active area of the device.

As previously disclosed, embodiments of the invention may provide for sub-pixels having a largest dimension measured approximately parallel to the substrate of not more than about 60 μm. For example, referring to FIGS. 1-2, a sub-pixel in the illustrated arrangement may be not more than about 60 μm as measured across the page and/or not more than about 60 μm measured in a direction perpendicular to the page.

As previously disclosed, embodiments of the invention may be fabricated by depositing or otherwise fabricating the various layers in a vertical stack. For example, in an embodiment an AMOLED may be fabricated by obtaining a transistor having a leakage current of not more than about $10^{-15}$ A/μm, and fabricating an organic light emitting device in electrical contact with the transistor, such that the transistor provides a control of the organic light emitting device. The organic light emitting device may be fabricated using OVJP or similar patterning techniques, and may include a colored OLED and/or a white OLED with a color filter.

Embodiments of the invention may include or be incorporated with a variety of devices. For example, embodiments of the invention may include full-color displays, flexible displays in consumer devices, mobile phones, pad computers, smartphones, portable computers, monitors, televisions, and consumer devices that include a flexible display.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device comprising:
   a plurality of organic light-emitting devices arranged to form a plurality of pixels having a combined resolution of at least 400 dpi; and
   a circuit configured to control at least one of the plurality of organic light-emitting devices, said circuit comprising at least one transistor having a leakage current of not more than about $10^{-15}$ A/μm to maintain a data voltage without reliance upon a gate-collector capacitor,
   wherein the at least one of the plurality of organic light-emitting devices controlled by the circuit comprises a sub-pixel, the sub-pixel having a largest dimension of not more than about 60 μm.

2. A device as recited in claim 1, wherein the circuit comprises no more than two transistors.

3. A device as recited in claim 2, wherein the at least one transistor comprises a metal oxide as an active layer.

4. A device as recited in claim 2, further comprising a compensation driver disposed outside an active area of the organic light-emitting device.

5. A device as recited in claim 4, wherein the at least one transistor comprises a metal oxide as an active layer.

6. A device as recited in claim 1, wherein the at least one transistor comprises a metal oxide as an active layer.

7. A device as recited in claim 1, wherein the device comprises a device type selected from the group consisting of: a full-color display, a flexible display in a consumer device, a mobile phone, a pad computer, a smartphone, a portable computer, a monitor, a television, and a consumer device including a flexible display.

8. A device as recited in claim 1, wherein the at least one transistor has a leakage current in the range of about $10^{-15}$ A/μm to about $10^{-24}$ A/μm.

9. An active matrix organic light emitting display, comprising:
   at least one Organic Light Emitting Device (OLED);
   a plurality of pixels, each pixel being independently addressable by a control circuit; and
   at least one OLED switching transistor having a leakage current of not more than about $10^{-15}$ A/μm to maintain a data voltage without reliance upon a gate-collector capacitor,
   wherein the display has a combined resolution of at least 400 dpi, and
   wherein each pixel comprises a plurality of sub-pixels, each sub-pixel having a largest dimension of not more than about 60 μm.

10. A display as recited in claim 9, wherein the control circuit comprises at least one transistor having a leakage current of not more than about $10^{-15}$ A/μm.

11. A display as recited in claim 10, wherein the circuit comprises no more than two transistors.

12. A display as recited in claim 9, wherein the at least one transistor has a leakage current in the range of about $10^{-15}$ A/μm to about $10^{-24}$ A/μm.

* * * * *